US009443773B2

(12) United States Patent
Vanhoucke et al.

(10) Patent No.: US 9,443,773 B2
(45) Date of Patent: Sep. 13, 2016

(54) IC AND IC MANUFACTURING METHOD

(75) Inventors: Tony Vanhoucke, Bierbeek (BE); Anco Heringa, Waalre (NL); Johannes Josephus Theodorus Martinus Donkers, Valkenswaard (NL); Jan Willem Slotboom, Eersel (NL)

(73) Assignee: NXP B.V., Eindhoven (NL)

( * ) Notice: Subject to any disclaimer, the term of this patent is extended or adjusted under 35 U.S.C. 154(b) by 484 days.

(21) Appl. No.: 13/148,023

(22) PCT Filed: Jan. 15, 2010

(86) PCT No.: PCT/IB2010/050187
§ 371 (c)(1),
(2), (4) Date: Oct. 11, 2011

(87) PCT Pub. No.: WO2010/089675
PCT Pub. Date: Aug. 12, 2010

(65) Prior Publication Data
US 2012/0038002 A1    Feb. 16, 2012

(30) Foreign Application Priority Data

Feb. 6, 2009  (EP) ................................... 09100103
Jan. 15, 2010  (WO) ................. PCT/IB2010/050187

(51) Int. Cl.
*H01L 21/8249*    (2006.01)
*H01L 27/06*      (2006.01)
(Continued)

(52) U.S. Cl.
CPC ....... *H01L 21/8249* (2013.01); *H01L 27/0623* (2013.01); *H01L 29/0821* (2013.01); *H01L 29/7322* (2013.01)

(58) Field of Classification Search
CPC ........... H01L 21/8249; H01L 29/0821; H01L 29/7322; H01L 27/0623

USPC .......... 257/370, E21.696, E27.015; 438/234, 438/202, 203
See application file for complete search history.

(56) References Cited

U.S. PATENT DOCUMENTS 4,764,482 A    8/1988  Hsu
4,918,026 A *  4/1990  Kosiak et al. ................ 438/207
(Continued)

FOREIGN PATENT DOCUMENTS

EP    0613181 A1    8/1994
GB    2459695 A     11/2009

OTHER PUBLICATIONS

Wosik, W. Diffusion, Part 1 [PowerPoint slides]. (Copyright 2000 by Prentice Hall). Retrieved from http://www0.egr.uh.edu/courses/ece/ECE6466/Chapter7_Diffusion_part1.ppt (accessed Sep. 29, 2014).*

(Continued)

*Primary Examiner* — Zandra Smith
*Assistant Examiner* — Lauren R Bell

(57) ABSTRACT

Disclosed is a method of manufacturing a vertical bipolar transistor in a CMOS process, comprising implanting an impurity of a first type into a the substrate (100) to form a buried region (150, 260) therein; forming a halo implant (134) using an impurity of a second type and a shallow implant (132) using an impurity of the first type, said halo implant enveloping the shallow implant in the substrate and being located over said buried region (150, 250); forming, adjacent to the halo implant (134), a further implant (136) using an impurity of the second type for providing a conductive connection to the halo implant; and providing respective connections (170, 160, 270) to the further implant (136), the shallow implant (132) and the buried region (150, 260) allowing the shallow implant, halo implant and buried region to be respectively operable as emitter, base and collector of the vertical bipolar transistor. Hence, an IC may be provided that comprises vertical bipolar transistors manufactured using CMOS processing steps only.

13 Claims, 6 Drawing Sheets

(51) Int. Cl.
*H01L 29/08* (2006.01)
*H01L 29/732* (2006.01)

(56) References Cited

U.S. PATENT DOCUMENTS

| | | | | |
|---|---|---|---|---|
| 4,920,071 | A * | 4/1990 | Thomas | 438/626 |
| 5,011,784 | A * | 4/1991 | Ratnakumar | 438/203 |
| 5,091,321 | A | 2/1992 | Huie et al. | |
| 5,877,539 | A * | 3/1999 | Yamazaki | 257/514 |
| 5,953,603 | A * | 9/1999 | Kim | 438/202 |
| 6,303,420 | B1 * | 10/2001 | Sridhar et al. | 438/202 |
| 6,716,709 | B1 * | 4/2004 | Springer et al. | 438/301 |
| 2001/0005608 | A1 * | 6/2001 | Johansson et al. | 438/202 |
| 2001/0042886 | A1 * | 11/2001 | Yoshida et al. | 257/341 |
| 2003/0111694 | A1 * | 6/2003 | Terashima | 257/370 |
| 2005/0258453 | A1 * | 11/2005 | Springer | 257/205 |
| 2007/0126064 | A1 * | 6/2007 | Pellizzer et al. | 257/378 |
| 2009/0159984 | A1 * | 6/2009 | Yoon | 257/378 |

OTHER PUBLICATIONS

Kim et al., "High Performance NPN BJTs in Standard CMOS process for GSM Receiver and DVB-H Tuner", IEEE RFIC Symposium, Jun. 11-13, 2006.

Sugawara, F., et al. "A New Lateral MOS-Gated Thyristor with Controlling Base-Current", IEEE Electron Device Letters, vol. 18, No. 10, Oct. 1997, pp. 483-485.

* cited by examiner

IC AND IC MANUFACTURING METHOD

FIELD OF THE INVENTION

The present invention relates to a method of manufacturing a vertical bipolar transistor in a CMOS process.

The present invention further relates to an integrated circuit (IC) comprising CMOS transistors as well as at least one vertical bipolar transistor.

BACKGROUND OF THE INVENTION

Nowadays, the vast majority of ICs are realized in complementary metal oxide on silicon (CMOS) technology, because of the high feature density that can be realized in this technology. The reduction in CMOS device feature size has further led to an improvement in the switching speeds of CMOS devices such that it has become feasible, at least in terms of switching speeds, to replace bipolar transistors in high-frequency components of ICs such as radio-frequency (RF) components with CMOS devices. This has the advantage that the number of process steps required for manufacturing the IC can be significantly reduced because it is no longer necessary to have two sets of processing steps for realizing components in different technologies.

However, the speed of the semiconductor device is not the only Figure of Merit (FoM) the designer has to deal with. Other parameters that are at least equally important include maximum frequency of oscillation (fT and fMAX) device, transconductance (gm), output conductance (go), matching, and 1/f noise and NF characteristics.

The required values of these performance parameters are not easily achieved with CMOS devices because the decrease in the feature size of CMOS devices has meant that their supply voltage has also been reduced for reliably operating the device and for reducing the power consumption of the IC. Consequently, the circuit design window has been significantly reduced, which introduces major design problems for e.g. power amplifiers or automotive circuits, for instance because the breakdown voltage of the CMOS devices is insufficient for high-voltage applications.

For analog applications, CMOS devices have been modified in many ways to achieve improved performance. Additional processing steps such as dual oxide technology and drain extensions have been introduced to increase the breakdown voltage of the devices, and additional implants, e.g. halo or pocket implants, have been proposed to counter the short channel effects and to control punch through. Such solutions have the drawback that they need additional process steps and/or additional masks, additional process development and qualification, leading to higher cost of the IC.

It is well known that vertical bipolar transistors are better suited for e.g. high voltage application domains than CMOS devices by virtue of a superior transconductance. Moreover, in a vertical bipolar transistor as suggested by its name, the main current flows vertically through the bulk as opposed to the lateral current flow through the channels of CMOS devices. This makes bipolar transistors much less sensitive to device degradation and allows for high power densities. Exploiting this vertical dimension can yield high breakdown voltages without requiring much extra silicon area compared to a corresponding CMOS device.

However, it is not trivial to manufacture a mixed technology IC. When implementing a manufacturing process with both CMOS and bipolar device manufacturing steps, often either the CMOS device performance suffers when a bipolar process is altered to include CMOS device processing steps, or the bipolar device performance suffers when a CMOS process is altered to include bipolar device processing steps. In addition, both scenarios generally require the inclusion of extra process steps and mask layers, adding to the complexity and cost of the IC manufacturing process.

For this reason, efforts have been undertaken to realize bipolar transistors using CMOS processing steps, since a fully CMOS-process compatible high-performance bipolar transistor device would enable circuit designers to combine the advantages of the (digital) CMOS part with the RF, high-voltage, high-power density and reliability capabilities of bipolar devices in a single technology.

However, the performance characteristics of the available implementations of bipolar devices that are fully compatible with state-of-the art standard CMOS processes i.e. that do not require any additional processing or mask layers to realize the bipolar devices, are significantly inferior to the performance characteristics of bipolar devices realized in dedicated bipolar processes. For instance, one known implementation is a vertical NPN bipolar transistor in CMOS triple-well technology in which the emitter is formed by a highly doped n-type drain region, the base is formed by the p-well and the collector is formed by the buried n-well. However, the thickness of the p-well and its relatively high impurity concentration deteriorate the performance of this bipolar transistor.

Kim et al. in "High Performance NPN BJTs in Standard CMOS process for GSM Receiver and DVB-H Tuner", IEEE RFIC Symposium, 11-13 Jun. 2006 disclose an improvement of the above bipolar transistor by replacing the p-well with a dedicated implant. This however requires additional mask and processing steps, which are not available in standard CMOS technology, thus significantly increasing the cost of such an IC.

SUMMARY OF THE INVENTION

The present invention seeks to provide a method of manufacturing an IC comprising an improved vertical bipolar transistor using CMOS processing steps.

The present invention further seeks to provide such an IC.

According to an aspect of the present invention, there is provided a method of manufacturing a vertical bipolar transistor in a CMOS process, comprising implanting an impurity of a first type into a the substrate to form a buried region therein; forming a halo implant using an impurity of a second type and a shallow implant using an impurity of the first type, said halo implant enveloping the shallow implant in the substrate and being located over said buried region, said halo implant vertically separating the shallow implant from the buried region; forming, adjacent to the halo implant, a further implant using an impurity of the second type for providing a conductive connection to the halo implant; and providing respective connections to the further implant, the shallow implant and the buried region allowing the shallow implant, halo implant and buried region to be respectively operable as emitter, base and collector of the vertical bipolar transistor.

Hence, the present invention is based on the realization that a halo implant, typically used to counter short-channel effects in a CMOS transistor can be advantageously used as a base on a vertical bipolar transistor because the limited thickness and the limited impurity concentration of the halo implant are particularly suitable to yield a bipolar transistor having improved breakdown characteristics. Preferably, the halo implant and the shallow implant are formed using a single mask step, as usually is the case when forming such implants around the channel of a MOSFET.

The vertical bipolar transistor may be a NPN transistor. In an embodiment, the buried layer acting as an n-type collector may be formed by forming a pair of n-wells separated by a predefined spacing; and forming the buried region in the predefined spacing by laterally diffusing the n-type impurity from said n-wells into the predefined spacing. This has the advantage that the depth of the buried region can be controlled by variation of the predefined spacing. This embodiment is particularly useful if the CMOS process does not include the formation of a buried n-well (BNwell).

The vertical bipolar transistor may be a PNP transistor. In an embodiment, the collector is formed using a p-type epitaxial layer in the substrate.

In order to provide a contact region to contact the halo implant, a further implant adjacent to the halo implant may comprise forming a deep implant in directly next to the halo implant such that the halo implant is in physical contact with the further implant. Alternatively, the step forming a further implant adjacent to the halo implant may comprise forming said implant separated from the halo implant by a channel region comprising an impurity of the first type, the method further comprising forming a gate over said channel region; providing a connection to said gate; and interconnecting the connection to the gate and the connection to the shallow implant region. In the latter arrangement, the thus formed MOS transistor is switched on every time the emitter of the bipolar transistor is engaged such that a hole current can flow between the further implant and the halo implant to provide a hole current to the base of the bipolar transistor.

In order to reduce the contact resistance and improve the conductivity of the shallow implant, the method may further comprise at least partially siliciding the shallow implant region prior to providing said connections. In an embodiment, said siliciding step comprises depositing a siliciding metal over the shallow implant region, patterning said siliciding metal and subsequently siliciding the shallow implant region in said pattern. This has the advantage that spiking of the silicide through the halo implant, thus providing a short between the collector and emitter, can be more effectively avoided.

According to a further aspect of the present invention, there is provided an integrated circuit manufactured by any of the various embodiments of the method of the present invention. Such an integrated circuit has a substrate comprising a plurality of buried regions comprising an impurity of a first type; a plurality of halo implants comprising an impurity of a second type; a plurality of a shallow implants comprising an impurity of the first type; and a further implant comprising an impurity of the second type, wherein some of the buried regions, halo implants and shallow implants form respective parts of respective CMOS transistors; and the pluralities of halo implants, shallow implants and buried layers further respectively comprise a further halo implant, a further shallow implant and a further buried layer, said further halo implant enveloping the further shallow implant and being located over the further buried region, said further halo implant vertically separating the further shallow implant from the further buried region wherein the further implant is located adjacent to the further halo implant for providing a conductive connection to the further halo implant; and the integrated circuit further comprising respective connections to the further implant, the shallow implant and the buried region for respectively operating the shallow implant, halo implant and buried region as emitter, base and collector of a vertical bipolar transistor.

Such an IC comprises a plurality of CMOS transistors and at least one bipolar transistor, with the bipolar transistor having been formed using conventional CMOS processing steps. Such an IC may be integrated in any suitable electronic device, such as amplifiers, mobile communication devices, and so on.

BRIEF DESCRIPTION OF THE EMBODIMENTS

Embodiments of the invention are described in more detail and by way of non-limiting examples with reference to the accompanying drawings, wherein.

DETAILED DESCRIPTION OF THE DRAWINGS

Figure 1:
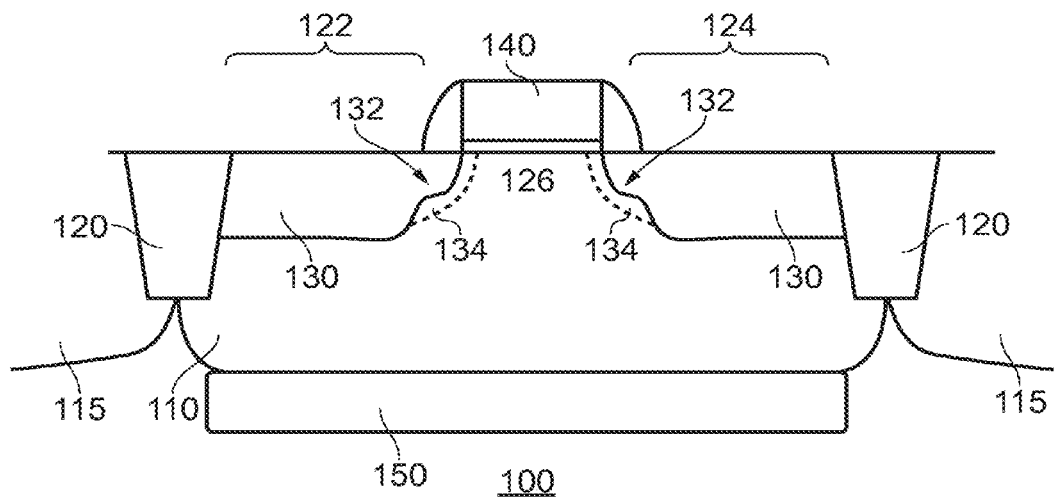
FIG. 1 depicts a known CMOS transistor.

It should be understood that the Figures are merely schematic and are not drawn to scale. It should also be understood that the same reference numerals are used throughout the Figures to indicate the same or similar parts.

FIG. 1 shows a known MOS type transistor, which is commonly available in technology libraries. The MOS field effect transistor (MOSFET) shown in FIG. 1 is a triple well n-type transistor formed in a substrate 100. Such a transistor may be formed by well-known CMOS processing steps, as will be briefly explained below.

In a first step, the substrate 100 has been implanted with an n-type impurity to form a buried n-layer 150, followed by a step in which a p-type impurity is implanted over the buried n-layer 150 to form a p-well 110. The p-well 110 may be formed in between neighboring n-wells 115 for forming an alternating pattern of transistors of an opposite conductivity type. The neighboring transistors are typically separated from each other by the formation of shallow trenches 120 that are filled with an insulating material such as $SiO_2$. These trenches prevent the formation of conductive paths between the neighboring transistors during their operation.

N-type source and drains 122 and 124 are formed on either side of a channel 126 by first implanting p-type pocket or halo implants 134 into the substrate followed by lightly doped drain (LDD) n-type implants 132. These regions are also referred to as shallow regions in the present application. These steps are usually performed using a single mask in the CMOS manufacturing process. Subsequently, the more heavily doped n-type source and drain implants 130 are formed, after which a gate 140 is formed over the channel 126.

The order of the above steps may be varied, for instance when the gate 140 is used for self-aligned implants such as the LDD implants. The devices may be completed by forming contacts to the source, gate, and drain regions, and, if necessary, e.g. for biasing purposes, to the p-well 110 and/or the buried n-well 150. The same sequence of steps may be used for the formation of p-type MOSFETs, in which case the opposite type of impurities are used, as will be apparent to the skilled person.

For the purpose of the present application, it is important to realize that the above MOSFETs are typically formed using well-known CMOS manufacturing techniques using appropriate mask sets. At this point, it is noted that it is known that the MOSFET arrangement of FIG. 1 may also be used to form a vertical bipolar transistor. To this end, the heavily doped n-type drain region 130 is used to form the emitter, the p-well 110 is used to form the base and the buried n-well 150 is used to form the collector of a vertical n-p-n bipolar transistor (a p-n-p bipolar transistor may be formed in a similar manner from a p-type MOSFET). Since the various parts of the bipolar transistor may be connected using CMOS processing steps, this bipolar transistor may be realized using CMOS processing steps only.

Figure 2:
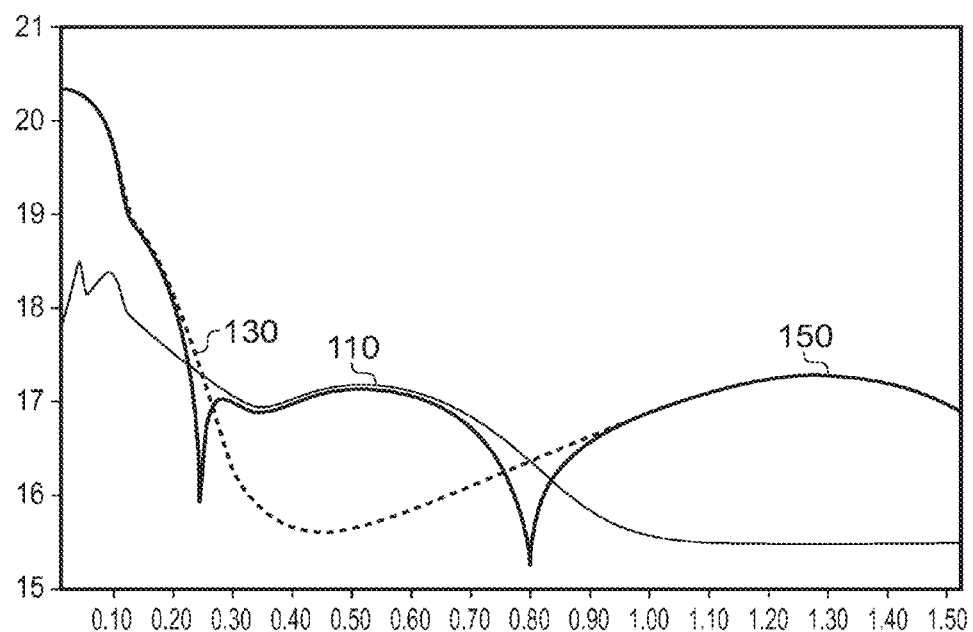
FIG. 2 depicts a doping profile of a known vertical bipolar transistor realized in triple-well CMOS technology.

However, the performance characteristics of such a bipolar transistor are quite unfavorable. It is well known that a desired profile for a vertical NPN-transistor comprises a highly doped n-type emitter profile, a thin and somewhat lower doped p-type base profile, especially in the vicinity of the base-collector interface and a gradually increasing n-type doped collector profile. The highly doped n-type impurity serves as low-Ohmic contact to the collector region. However, when looking at the doping profile in FIG. 2 of the vertical NPN bipolar transistor formed as described above, it will be immediately apparent that its p-type base layer is thicker and higher doped near the interface with the collector than ideal for operation in high frequency application domains.

TCAD computer simulations in 1D of the aforementioned NPN bipolar transistor using typical doping profiles of a 140 nm NXP CMOS process predict values of $f_T$=2.5 GHz at $V_{CB}$=1.0 V, open-base breakdown voltage $BV_{CEO}$=5.5 V and a DC current gain ($h_{FE}$) of ~100. The limited value of the peak $f_T$ is the result of the large base transit time due to the wide base layer as formed by the Pwell. The low breakdown voltage is caused by the high doping levels at the collector base junction.

Figure 3:
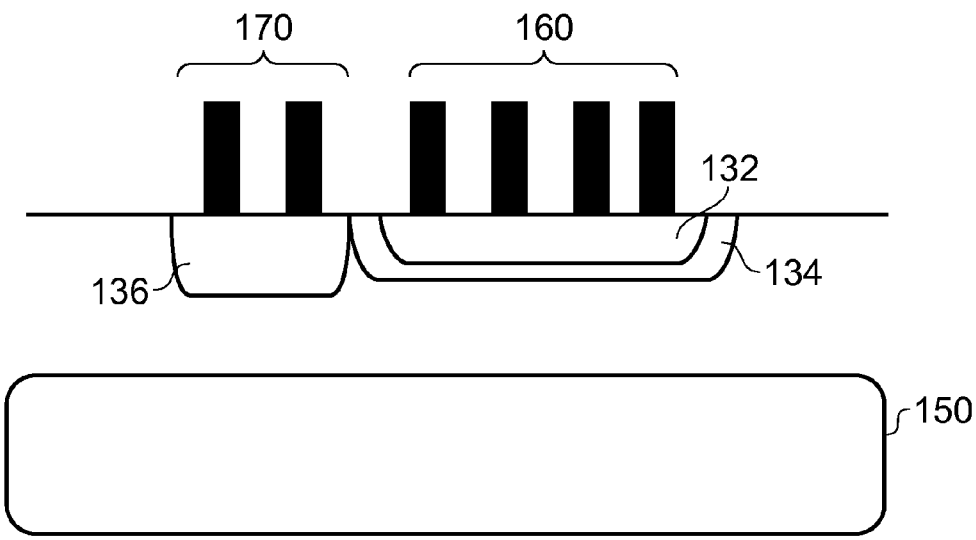
FIG. 3 depicts a vertical bipolar transistor in accordance with an embodiment of the present invention.

However, it has been realized by the inventors of the present invention that an improved vertical bipolar transistor may be designed using standard CMOS processing steps. An example of an NPN vertical bipolar transistor in accordance with an embodiment of the present invention is shown in FIG. 3. Basically, a buried N-layer 150 is formed in the usual manner. However, when implanting the P-well 110 over the buried N-layer 150, the region of the substrate where the NPN bipolar transistor is to be formed is shielded, e.g. masked, such that the P-well 110 is not formed in this region. Subsequently, the p-type halo implants 134 and the n-type LDD regions 132 may be formed as usual, e.g. by using a single mask. This mask includes such regions to be implanted in the region designated to the NPN vertical bipolar transistor.

However, the NPN vertical bipolar transistor region is again shielded, e.g. by masking, from the step in which the heavily doped n-type drain regions are formed for the respective n-type MOSFETs of the IC. Consequently, the halo implant 134 is not largely replaced by the high levels of n-type impurity of the highly doped drain region, but is maintained as a separate implant surrounding the shallow drain extension, i.e. LDD, implant 132 in the substrate 100, with the n-type LDD implant 132 forming the emitter, the halo implant 134 forming the base and the buried N-layer forming the collector of the vertical bipolar transistor. In other words, the halo implant 134 is used to vertically separate the shallow implant 132 from the buried layer 150, thus defining respective vertical p-n junctions with the buried layer 150 and with the shallow implant 132.

In the embodiment of FIG. 3, a connection to the p-type halo implant 134 is provided by implanting a highly doped p-type region 136 next to the halo implant 134 such that the highly doped p-type region 136 is in physical, i.e. conductive contact with the halo implant 134. The highly doped p-type region 136 may be formed in the CMOS step in which the p-type highly doped drain and source regions of the p-MOSFETs are formed by also exposing the region 136 to such an implant step. Alternatively, the contact region 136 may be formed by carefully aligning the masks for forming the p-MOSFET drain implant mask and the n-MOSFET drain extension mask.

The additional implant of contact region 136 is necessary because the halo implant itself cannot be horizontally extended to provide a contact area due to the fact that the halo implant 134 is preferably formed using the same mask as used for the subsequent formation of the LDD region 132.

The contacts 160 to the lightly doped n-type region 132 and the contacts 170 to the heavily doped p-type region 136, respectively serving as emitter and base contacts, may be formed in any suitable way, e.g. simultaneous with the formation of the drain and source contacts of the MOSFETs in other regions of the IC. The conductivity of the lightly doped n-type region 132 may be enhanced by exposing this region to a silicidation step, as will be explained in more detail later. The collector contact, i.e. the contact to the buried N-layer 150, may be provided in any suitable way. CMOS compatible methods for forming buried layer contacts are well-known to the skilled person, and are not further explained for reasons of brevity only.

Figure 4:
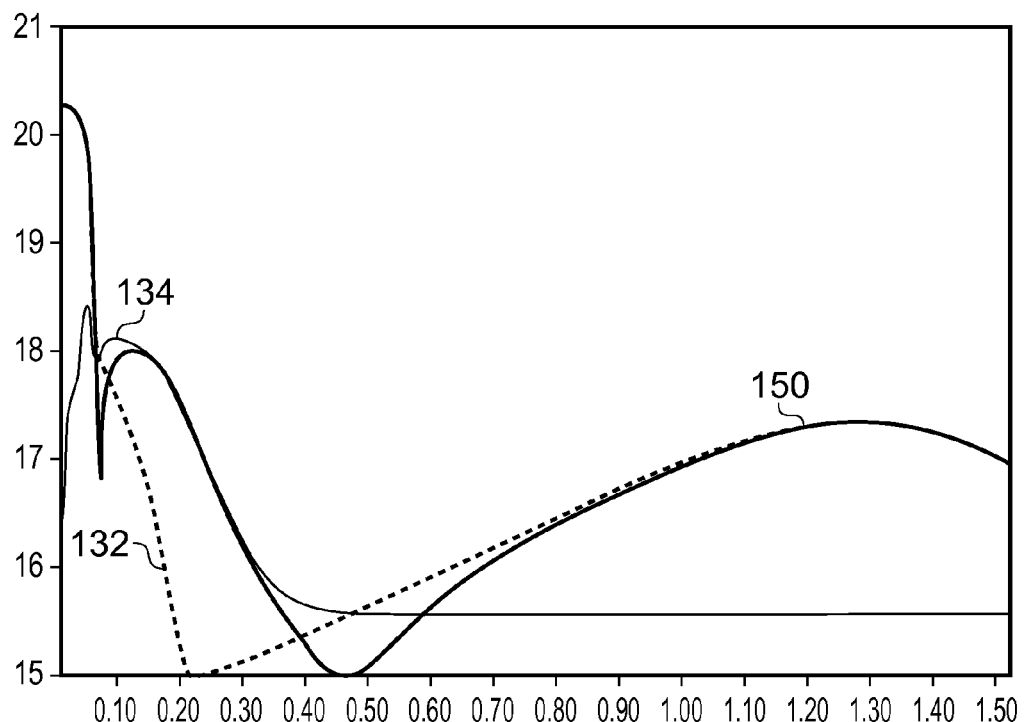
FIG. 4 depicts a doping profile of a vertical bipolar transistor in accordance with an embodiment of the present invention.

The doping profile of the NPN bipolar transistor of FIG. 3 is shown in FIG. 4. It will be immediately apparent that the base layer formed by the p-type halo implant 134 is much shallower than the base layer formed by the p-well 110 in FIG. 2. This significantly improves the peak $f_T$ of the bipolar transistor because of the reduction in charge carrier transit time through the much thinner base layer. Moreover, the low concentration of the base implant at the base-collector interface significantly improves the breakdown characteristics of the vertical bipolar transistor. TCAD computer simulations in 1D of the NPN bipolar transistor of FIG. 3 using typical doping profiles of a 140 nm NXP CMOS process predict values of $f_T$=7 GHz at $V_{CB}$=1.0 V, open-base breakdown voltage $BV_{CEO}$=10 V, a collector-base breakdown voltage $BV_{CBO}$ of 30 V and a DC current gain ($h_{FE}$) of ~70. It is pointed out for the sake of completeness that the implementation of the vertical bipolar transistor in a CMOS process is not limited to the above technology. This bipolar transistor may be implemented in any suitable CMOS process. For instance, TCAD computer simulations in 1D of the NPN bipolar transistor of FIG. 3 in the NXP 45 nm CMOS process suggest that such a transistor would have a $f_T$=20 GHz at $V_{CB}$=1.0 V and a $BV_{CEO}$=15 V.

Figure 5:
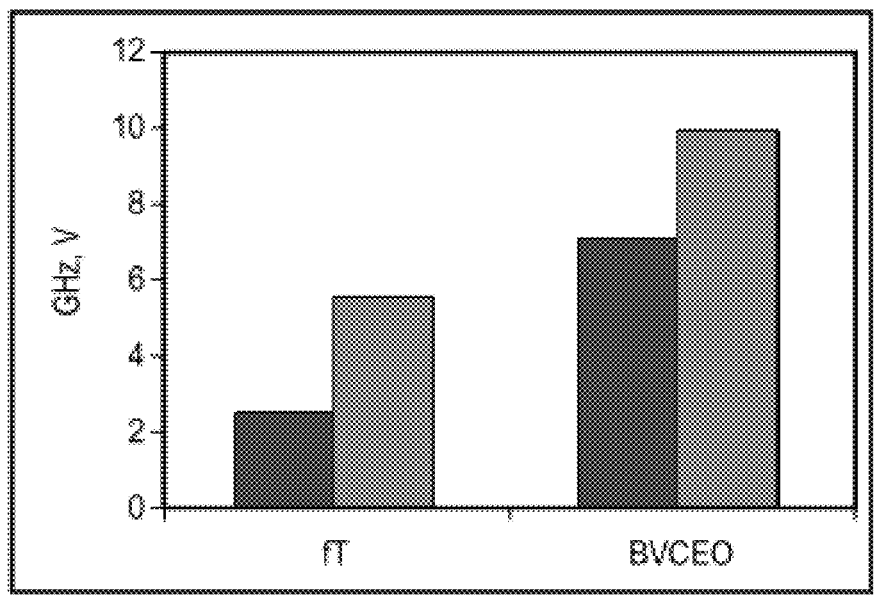
FIG. 5 shows a comparison between selected performance parameters of the known vertical bipolar transistor and a vertical bipolar transistor in accordance with an embodiment of the present invention.

FIG. 5 depicts a comparison between the fT and BVCEO of the vertical bipolar transistors of FIG. 1 (dark bars) and of the present invention (light bars). The improvement of the present invention vertical bipolar transistor over the prior art vertical bipolar transistor is immediately apparent.

At this point, it is noted that although FIG. 3 shows a NPN bipolar transistor, the teachings of the present invention may equally be applied to form a PNP bipolar transistor, in which the p-type collector may be formed by an epitaxial p-type layer or another buried p-type structure, with the emitter and base formed by p-type extension regions and n-type halo implants, i.e. the implants used for forming source and drain regions of the p-MOSFETs.

In FIG. 3, the additional implant 136 has been formed in physical contact with the halo implant 134 to act as a contact region for the base of the vertical bipolar transistor. However, it should be appreciated that this arrangement was shown by way of non-limiting example only, and that other suitable contacting arrangements will be available to the skilled person.

Figure 6:
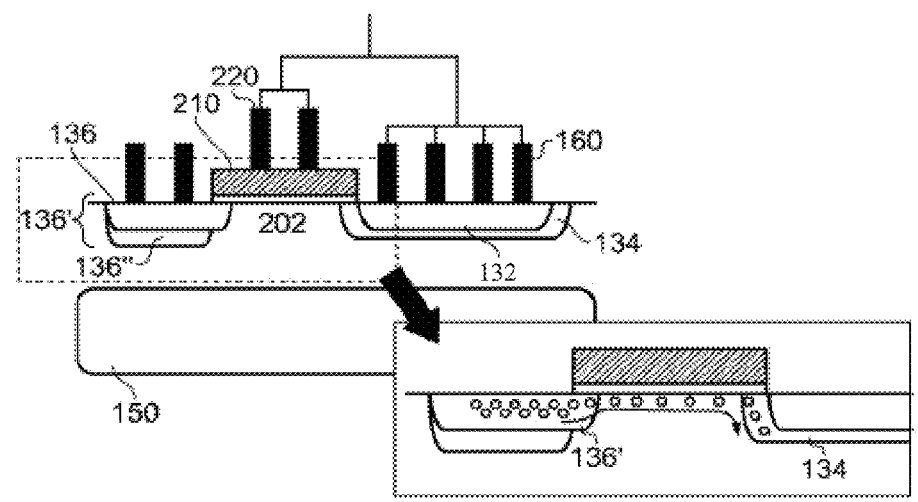
FIG. 6 depicts a vertical bipolar transistor in accordance with another embodiment of the present invention.

An example of such an alternative arrangement is shown in FIG. 6, in which the p-doped contact region 136 is spaced from the halo implant 134 by an n-type channel 202 covered by a gate 210. The contact region 136 is formed by a lightly doped region 136" and a more heavily doped region 136', and may be formed in the same steps as forming the drain/source regions of a p-MOSFET, as previously explained (the n-type halo of this implant is not shown in FIG. 6). The gate 210 and underlying gate dielectric may be formed in the same steps as forming the gates of the MOSFETs of the IC. The gate 210 has its contacts 220 conductively coupled to the emitter terminal contacts, i.e. the contacts 160 to the LDD region 132, such that when the emitter of the vertical bipolar transistor is activated, a hole base current can flow from the contact region 136 to the halo implant 134, as shown in the inset in the right hand bottom of FIG. 6. This is because the MOSFET formed by the contact region 136, channel 202 and halo implant 134 is switched to a conductive state when the emitter is provided with a voltage above the threshold voltage of this MOSFET.

The operating principle of such a transistor-bridged contact has already been demonstrated in literature; see for instance F. Sugawara et al. in "A New Lateral MOS-Gated Thyristor with Controlling Base-Current", IEEE Electron Device Letters, Vol. 18, No. 10, October 1997, pages 483-485.

Figure 7:
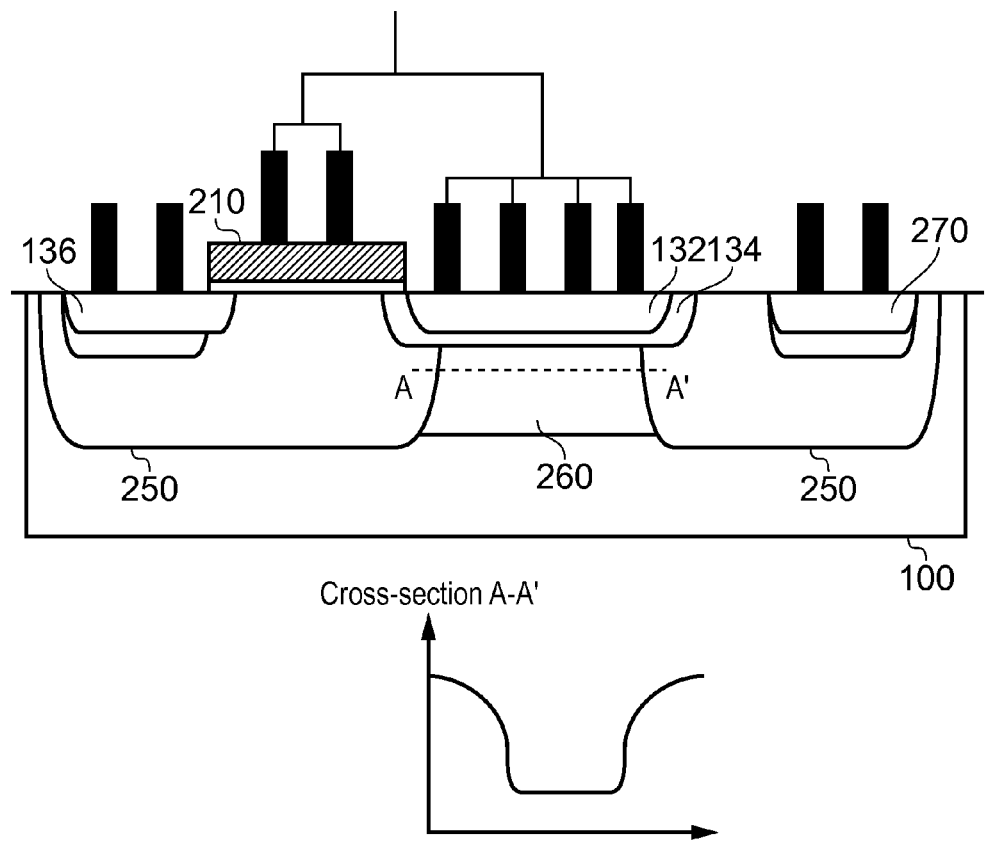
FIG. 7 depicts a vertical bipolar transistor in accordance with yet another embodiment of the present invention.

It is moreover pointed out that the presence of a buried N-layer 150, or an equivalent buried p-type layer in case of a PNP bipolar transistor is not essential to the present invention. FIG. 7 shows an alternative embodiment of a NPN vertical bipolar of the present invention, in which the buried N-layer 150 is absent. The collector of the bipolar transistor is formed by two implanted n-wells 250 that are spaced apart by a gap 260 comprising the collector of the NPN vertical bipolar transistor. This will be explained in more detail below.

During activation of the n-wells 250, e.g. by submitting them to a thermal budget, the n-type impurities diffuse through the substrate 100. Said diffusion process comprises a distinct lateral diffusion component, which is utilized in forming the collector under the halo implant 134. It is known that such lateral diffusion processes cause the formation of a so-called 'pinched' diffusion profile, i.e. a diffusion profile that is significantly thinner than the overall vertical thickness of the n-wells 250. This pinched diffusion profile in between the two n-wells 250 forms the collector profile of the NPN bipolar transistor of FIG. 7. The overall n-type impurity profile thickness along the line A-A' is shown in the graph, clearly demonstrating the reduction in profile thickness in the gap 260 under the halo implant 134. The thickness of the pinched profile may be tuned by choosing an appropriate predefined spacing between the n-wells 250, such that variations in this spacing may be used to tune the properties of the vertical bipolar transistor.

The collector contact may be provided by implanting an n-type contact region 270 into one of the n-wells 250, and subsequently providing collector contacts to this region. The formation of n-well contacts is a routine skill in CMOS technology and will not be further explained for reasons of brevity only.

It will be appreciated that although FIG. 7 has been explained in terms of an NPN vertical bipolar transistor, a PNP vertical bipolar transistor may also be formed in this manner by using impurities of the opposite type, e.g. p-wells instead of n-wells and so on. It is also pointed out that although FIG. 7 has been explained in the absence of a buried N-layer 150, the n-wells 250 may actually be present together with the buried N-layer 150. This has the advantage that the beneficial vertically graded profile of the collector of the vertical bipolar transistor may be tuned by the variation of the spacing of the n-wells 250, the implant energy of the buried n-layer 150 or both. This way, the $f_T/BV_{CEO}$ tradeoff can be better controlled.

Figure 8:
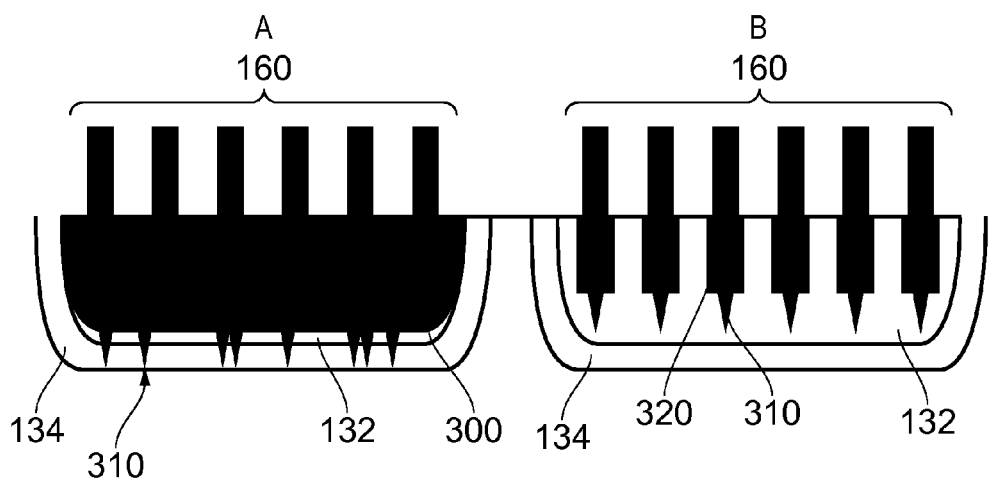
FIG. 8 depicts an aspect of a vertical bipolar transistor in accordance with an embodiment of the present invention.

It may be desirable to silicide the emitter contact, i.e. LDD region 132, to reduce the resistance of this contact. Silicidation is a routine technique is CMOS processes, and it is therefore not necessary to elaborate on this step. However, as is shown in FIG. 8, pane A, care has to be taken that the silicide spikes 310 of the formed silicide 300 do not penetrate the halo implant 134, because this would cause a short in the vertical bipolar transistor. To avoid this problem, the silicide metal may be patterned prior to the thermal silicidation step, such that small silicide islands 320 are formed during said silicidation (pane B). Alternatively, such islands 320 may be formed by spacing multiple gate structures closely together in between the contacts such that the silicide is only formed in between the gates, thus forming the silicide islands 320. Consequently, the silicide process does not penetrate the LDD region 132 as deeply such that the silicide spikes 310 do not penetrate the halo implant 134, thus avoiding the risk of the vertical bipolar transistor shorting because of a silicide spike 310 penetrating the halo implant 134.

Figure 9:
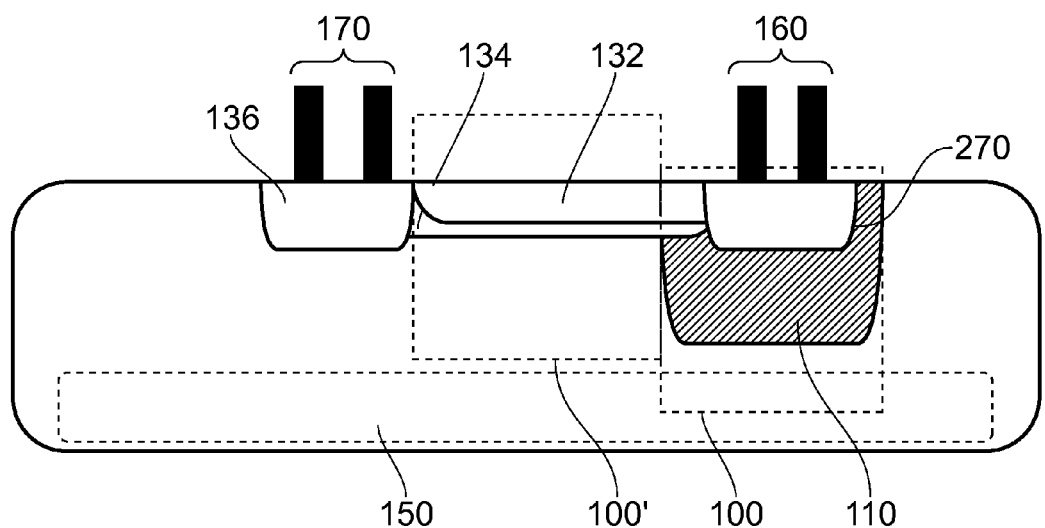
FIG. 9 depicts a vertical bipolar transistor in accordance with a further embodiment of the present invention.
Figure 10:
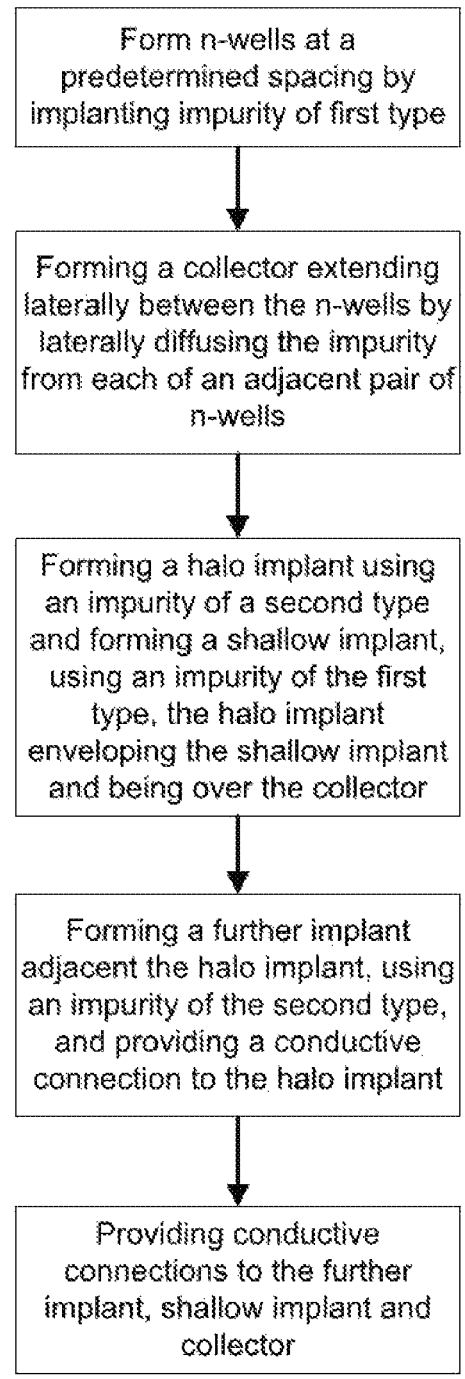
FIG. 10 depicts a method as may be implemented consistent with one or more embodiments of the present invention.

An alternative solution to providing a low-ohmic emitter contact 160 in which the salicidation of an emitter contact area may be avoided is shown in FIG. 9. The bipolar transistor in FIG. 9 is a combination of a known bipolar transistor 100, such as the transistor that is shown in FIG. 1 with a bipolar transistor 100' according to the present invention, in which the halo implant 134 extends under the lightly-doped drain shallow implant 132 such that two vertical p-n junctions are formed in the bipolar transistor, i.e. the p-n junction between the lightly-doped drain shallow implant 132 and the halo implant 134 as well as the p-n junction between the halo implant 134 and the buried region 150.

This embodiment distinguishes itself from the previously shown embodiments of the present invention in that part of the halo implant 134 is overdoped by the deep implant 270 in the region of conventional bipolar transistor 100. The emitter region further comprises a n-type contact region 270 and a p-well 110, thus forming a prior art bipolar transistor 100 that can be formed using standard CMOS processing steps.

The contact region 136 for the base contacts 170 is located on the opposite side of the halo implant 134. Alternatively, the contact region 136 for the base contacts may be located in the transistor 100, in which case it forms a contact with the p-well 110. In this embodiment, the known bipolar transistor 100 acts as a contact whereas the bipolar transistor 100' acts as the current-transporting device. In order to ensure that the breakdown voltage of the device of FIG. 9 is sufficiently high, the buried layer 150 may be buried at a larger depth than the bipolar transistor of e.g. FIG. 3. The contribution of the conventional bipolar transistor 100 to the overall current of the device of FIG. 9 can further be minimized by device scaling; in case the area of the bipolar transistor 100 is kept large compared to the area of the bipolar transistor 100', the device characteristics will be dominated by the smaller bipolar transistor of the present invention, such that a fast transistor with favorable breakdown characteristics is obtained.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. A method of manufacturing a vertical bipolar transistor in a CMOS process, comprising:
    forming a collector by:
        implanting an impurity of a first type into a substrate to form n-wells in the substrate and separated from one another at a predefined spacing; and
        connecting, after implanting the n-wells, the n-wells by laterally diffusing the impurity of the first type from each of said n-wells into a portion of the substrate between the n-wells;
    forming a halo implant using an impurity of a second type and a shallow implant using an impurity of the first type, said halo implant enveloping the shallow implant in the substrate and being located over the laterally-diffused impurities of the collector, said halo implant vertically separating the shallow implant from the laterally-diffused impurities of the collector;
    forming, laterally spaced from the halo implant, a further implant using an impurity of the second type for providing a conductive connection through a MOSFET channel and to the halo implant, wherein the MOSFET channel is formed in one of the n-wells; and
    providing respective conductive connections to the further implant, the shallow implant and the collector allowing at least a portion of each of the shallow implant, the halo implant and the collector to be respectively operable as an emitter, base and collector of the vertical bipolar transistor.

2. The method of claim 1, wherein the collector is formed with a pinched diffusion profile,
    the emitter, base and collector of the vertical bipolar transistor are arranged vertically and in contact with one another, and
    the collector of the vertical bipolar transistor includes the laterally-diffused impurity of the first type and is directly below the halo implant.

3. The method of claim 1, wherein the collector is formed with a pinched diffusion profile between the n-wells and vertically below the halo implant and the shallow implant.

4. The method of claim 1, further comprising:
    forming a gate over said MOSFET channel;
    providing a conductive connection to said gate; and
    interconnecting the conductive connection to the gate and the conductive connection to the shallow implant.

5. The method of claim 1, further comprising at least partially siliciding the shallow implant prior to providing said conductive connections.

6. The method of claim 5, wherein said at least partially siliciding comprises depositing a siliciding metal over the shallow implant, patterning said siliciding metal and, after patterning said siliciding metal, at least partially siliciding the shallow implant according to said patterning.

7. The method of claim 1, wherein forming the halo implant and forming the shallow implant include using a single mask.

8. The method of claim 1, wherein the respective steps of forming the collector, forming the halo implant and forming the shallow implant include forming the collector, the halo implant and the shallow implant in a vertical stack with the halo implant being over and in contact with the collector and with the shallow implant being over and in contact with the halo implant.

9. An integrated circuit comprising:
    a substrate;
    a plurality of collector regions in the substrate;
    n-wells in the substrate, each n-well having impurities of a first conductivity type;
    a collector in each of the collector regions, each of the collectors extending laterally between and connecting a respective two n-wells of the n-wells to one another by laterally-diffused impurities from the respective two n-wells, the laterally-diffused impurities extending through an entire respective gap between the respective two n-wells and forming a pinched diffusion profile relative to the impurities of the respective two n-wells;
    a plurality of halo implant regions comprising an impurity of a second conductivity type;
    a plurality of shallow implant regions comprising the impurity of the first conductivity type; and
    a further implant region comprising the impurity of the second conductivity type;
    wherein a first set of some of the collector regions, halo implant regions and shallow implant regions form respective parts of respective CMOS transistors;
    a second set of some of the plurality of collector regions, plurality of halo implant regions, further implant region, and plurality of shallow implant regions form respective parts of a vertical bipolar transistor in which one halo region vertically separates the laterally-diffused impurities of one collector region from one shallow implant region;
    wherein the further implant region is located adjacent to the one halo implant region and configured and arranged to provide a conductive connection to the one halo implant region through a MOSFET channel, wherein the MOSFET channel is formed in one n-well of the respective two n-wells; and
    wherein the vertical bipolar transistor further includes respective conductive connections to the second set of some of the shallow implant regions, the halo implant regions, and the collector regions for respectively operating as an emitter, base and collector of the vertical bipolar transistor.

10. The integrated circuit of claim 9, wherein the pinched diffusion profile includes a diffusion profile that is thinner than an overall thickness of the respective two n-wells.

11. The integrated circuit of claim 9, wherein said MOSFET channel being covered by a gate controlled by the conductive connection to the one shallow implant region.

12. The integrated circuit of claim 9, wherein of the one shallow implant region of the vertical bipolar transistor is at least partially silicided.

13. An electronic device comprising: the integrated circuit of claim 9, the integrated circuit being within a mobile communication device.

* * * * *